United States Patent
Kim et al.

(10) Patent No.: US 11,550,653 B2
(45) Date of Patent: Jan. 10, 2023

(54) MEMORY SYSTEM, OPERATION METHOD OF THE SAME, AND MEMORY CONTROLLER

(71) Applicant: SK hynix Inc., Gyeonggi-do (KR)

(72) Inventors: Tae-Pyeong Kim, Gyeonggi-do (KR); Jae-Woo Kim, Gyeonggi-do (KR); Hyun-Jin Noh, Gyeonggi-do (KR); Pyo-Young Han, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/683,616

(22) Filed: Mar. 1, 2022

(65) Prior Publication Data
US 2022/0188183 A1 Jun. 16, 2022

Related U.S. Application Data

(62) Division of application No. 16/570,504, filed on Sep. 13, 2019, now Pat. No. 11,307,926.

(30) Foreign Application Priority Data

Dec. 20, 2018 (KR) ........................ 10-2018-0166244

(51) Int. Cl.
*G06F 11/00* (2006.01)
*G06F 11/07* (2006.01)
*G11C 7/22* (2006.01)

(52) U.S. Cl.
CPC ...... *G06F 11/0793* (2013.01); *G06F 11/0727* (2013.01); *G06F 11/0751* (2013.01); *G11C 7/222* (2013.01)

(58) Field of Classification Search
CPC ............. G06F 11/0793; G06F 11/0727; G06F 11/0751; G06F 11/1604; G06F 11/1679
See application file for complete search history.

(56) References Cited

U.S. PATENT DOCUMENTS

| 9,881,662 B2 * | 1/2018 | Giovannini ........... G11C 11/409 |
| 2007/0217559 A1 * | 9/2007 | Stott ..................... H04L 7/0008 375/355 |
| 2014/0195728 A1 * | 7/2014 | Hsu ..................... G06F 11/1679 711/105 |

* cited by examiner

*Primary Examiner* — Katherine Lin
(74) *Attorney, Agent, or Firm* — IP & T Group LLP (57) ABSTRACT

A method for operating a memory system includes: performing a first training operation for alignment between a clock and a data strobe signal; performing a second training operation for alignment between the data strobe signal and the data; detecting an error of the second training operation; and adjusting a delay value of the data strobe signal in response to the detection of the error.

5 Claims, 7 Drawing Sheets

MEMORY SYSTEM, OPERATION METHOD OF THE SAME, AND MEMORY CONTROLLER

CROSS-REFERENCE TO RELATED APPLICATIONS

This application is a division of U.S. patent application Ser. No. 16/570,504 filed on Sep. 13, 2019, which claims benefits of priority of Korean Patent Application No. 10-2018-0166244, filed on Dec. 20, 2018. The disclosure of each of the foregoing application is incorporated herein by reference in its entirety.

BACKGROUND

1. Field

Exemplary embodiments of the present invention relate to a memory system.

2. Description of the Related Art

In a memory device, a clock and a data strobe signal are used. In a specification of a memory device, a domain crossing margin (i.e., tDQSS) between a data strobe signal and a clock is determined. Accordingly, an operation such as a write leveling operation for calibrating a skew between the data strobe signal and the clock can be performed in the memory device.

The write leveling operation is performed in such a manner that the memory device samples the level of the clock at a rising edge of the data strobe signal and feeds back the sampling result to a memory controller. The memory controller may control the phase of the data strobe signal by using the sampling result to satisfy the domain crossing margin.

After the write leveling operation, a write data (DQ) training operation is performed to calibrate the skew between the data strobe signal and the data. The write DQ training operation is an operation of controlling the phase of data such that a rising edge of the data strobe signal is aligned to the center of the data. Since a write operation may be performed correctly only when both the write leveling operation and the write DQ operation are normally performed in the memory system, it is necessary to perform these operations correctly in the memory system.

SUMMARY

Embodiments of the present invention are directed to a memory system capable of reducing errors of training operations related to a write operation.

In accordance with an embodiment of the present invention, a method for operating a memory system includes: performing a first training operation for alignment between a clock and a data strobe signal; performing a second training operation for alignment between the data strobe signal and the data; detecting an error of the second training operation; and adjusting a delay value of the data strobe signal in response to the detection of the error.

In accordance with another embodiment of the present invention, a memory controller includes: a clock transfer circuit suitable for transferring a clock; a data strobe signal transfer circuit suitable for transferring a data strobe signal; a data strobe signal delay circuit suitable for delaying a preliminary data strobe signal by a first delay value to generate the data strobe signal; a data receiving circuit; a data transfer circuit suitable for transferring data; a data delay circuit suitable for delaying a preliminary data by a second delay value to generate the data; a first training control circuit suitable for adjusting the first delay value in response to a signal received by the data receiving circuit during a first training operation for alignment between the clock and the data strobe signal; and a second training control circuit for adjusting the second delay value in response to a signal received by the data receiving circuit during a second training operation for alignment between the data strobe signal and the data, wherein, when the second training control circuit detects an error of the second training operation, the second training control circuit adjusts the first delay value.

In accordance with yet another embodiment of the present invention, a memory system includes: a memory controller; and a memory, wherein the memory controller comprises: a clock transfer circuit suitable for transferring a clock; a data strobe signal transfer circuit suitable for transferring a data strobe signal; a data strobe signal delay circuit suitable for delaying a preliminary data strobe signal by a first delay value to generate the data strobe signal; a first data receiving circuit; a first data transfer circuit suitable for transferring data; a data delay circuit suitable for delaying a preliminary data by a second delay value to generate the data; a first training control circuit suitable for adjusting the first delay value in response to a signal received by the first data receiving circuit during a first training operation for alignment between the clock and the data strobe signal; and a second training control circuit for adjusting the second delay value in response to a signal received by the first data receiving circuit during a second training operation for alignment between the data strobe signal and the data, and the memory comprises: a clock receiving circuit suitable for receiving the clock; a data strobe signal receiving circuit suitable for receiving the data strobe signal; a clock sampling circuit suitable for sampling the clock in synchronization with the data strobe signal during the first training operation to produce a sampling result; a second data receiving circuit suitable for receiving the data based on the data strobe signal that is received by the data strobe signal receiving circuit; a second data transfer circuit suitable for transferring the sampling result during the first training operation, and feeding back the data received by the second data receiving circuit during the second training operation, wherein, when the second training control circuit detects an error of the second training operation, the second training control circuit adjusts the first delay value.

In accordance with still another embodiment of the present invention, a memory system includes: a memory controller suitable for adjusting a first delay value for a data strobe signal in response to a sampling result for alignment between a clock and the data strobe signal during a first training operation, adjusting a second delay value for data in response to feedback data for alignment between the data strobe signal and the data during a second training operation which is performed after the first training operation, and when an error of the second training operation is detected, adjusting the first delay value and then performing the first training operation and the second training operation again; and a memory suitable for sampling the clock received from the memory controller based on the data strobe signal received from the memory controller to produce a sampling result during the first training operation and transferring the sampling result to the memory controller, receiving the data from the memory controller based on the data strobe signal received from the memory controller during the second training operation, and transferring the received data to the memory controller as the feedback data.

In accordance with still another embodiment of the present invention, a memory system includes: a memory; and a controller suitable for: performing a training operation for alignment between a data strobe signal and a clock; repetitively monitoring a skew between a data strobe signal and data by transmitting the data to the memory and receiving the data from the memory; adjusting a phase of the data based on the monitoring and transmitting the adjusted data to the memory; and when the skew is continuously monitored by repetitively monitoring, performing the training operation again.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
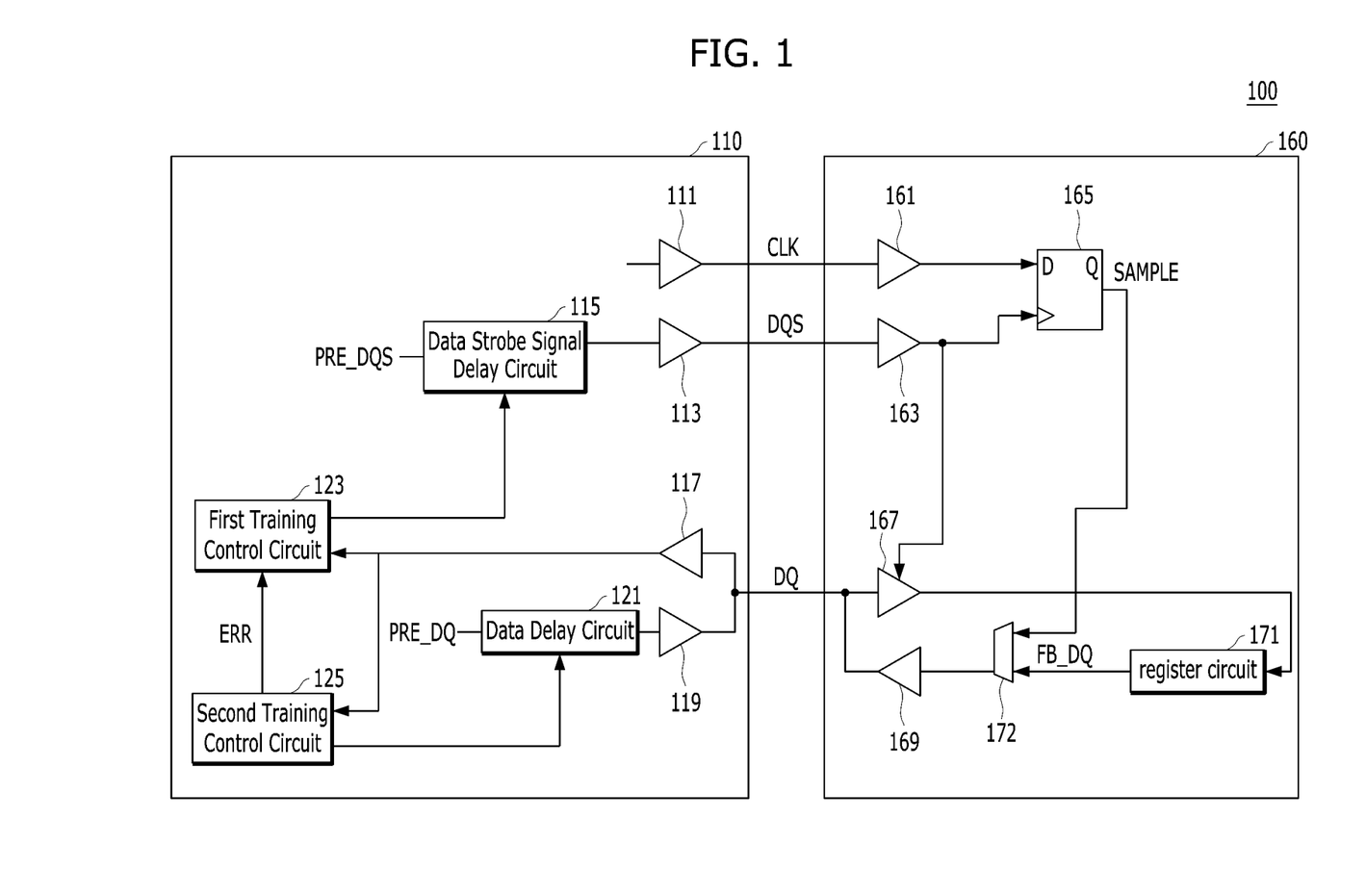
FIG. 1 is a block diagram illustrating a memory system in accordance with an embodiment of the present invention.

FIG. 1 is a block diagram illustrating a memory system 100 in accordance with an embodiment of the present invention.

Referring to FIG. 1, the memory system 100 may include a memory controller 110 and a memory 160. It is noted that FIG. 1 shows only the portions related to the training operations related to a write operation of the memory controller 110 and the memory 160.

The memory controller 110 may control operations such as a read operation and a write operation of the memory 160. The memory controller 110 may perform a write leveling operation and a write data (DQ) training operation, which are training operations for seamless data transfer during a write operation. The memory controller 110 may include a clock transfer circuit 111, a data strobe signal transfer circuit 113, a data strobe signal delay circuit 115, a data receiving circuit 117, a data transfer circuit 119, a data delay circuit 121, a first training control circuit 123, and a second training control circuit 125.

The memory controller 110 may generate a clock CLK and a data strobe signal DQS. The clock transfer circuit 111 may transfer the clock CLK to the memory 160. The data strobe signal transfer circuit 113 may transfer the data strobe signal DQS to the memory 160. The data receiving circuit 117 may receive a data DQ from the memory 160. The data transfer circuit 119 may transfer the data DQ to the memory 160. The data strobe signal delay circuit 115 may delay a preliminary data strobe signal PRE_DQS to generate the data strobe signal DQS. The data strobe signal delay circuit 115 may adjust a delay value under the control of the first training control circuit 123. The data delay circuit 121 may delay a preliminary data PRE_DQ to generate the data DQ. The data delay circuit 121 may adjust a delay value under the control of the second training control circuit 125.

The first training control circuit 123 may control a write leveling operation for alignment between the clock CLK and the data strobe signal DQS. During a write leveling operation, the first training control circuit 123 may adjust the delay value of the data strobe signal delay circuit 115 in response to a signal received through the data receiving circuit 117, that is, a sampling result received from the memory 160. When the second training control circuit 125 activates an error signal ERR, the first training control circuit 123 may adjust the delay value of the data strobe signal delay circuit 115 in such a manner that the delay value of the data strobe signal DQS is increased or decreased by one clock, and then perform a write leveling operation again.

The second training control circuit 125 may control a write DQ training operation for alignment between the data strobe signal DQS and the data DQ. During the write DQ training operation, the second training control circuit 125 may adjust the delay value of the data delay circuit 121 in response to the data fed back from the memory 160 through the data receiving circuit 117. The second training control circuit 125 may activate the error signal ERR when an error of a write DQ training operation occurs, that is, when a write DQ training operation fails.

The memory 160 may perform operations such as a read operation and a write operation under the control of the memory controller 110. The memory 160 may perform a write leveling operation and a write DQ training operation, which are training operations for seamless data transfer during a write operation, along with the memory controller 110. The memory 160 may include a clock receiving circuit 161, a data strobe receiving circuit 163, a clock sampling circuit 165, a data receiving circuit 167, a data transfer circuit 169, and a register circuit 171.

The clock receiving circuit 161 may receive the clock CLK from the memory controller 110. The data strobe receiving circuit 163 may receive the data strobe signal DQS from the memory controller 110.

The clock sampling circuit 165 may sample the clock CLK received by the clock receiving circuit 161 at a rising edge of the data strobe signal DQS which is received through the data strobe receiving circuit 163. The clock sampling circuit 165 may be implemented with a D-flipflop. A sampling result SAMPLE of the clock sampling circuit 165 may be transferred to the memory controller 110 through the data transfer circuit 169 during a write leveling operation.

The data receiving circuit 167 may receive the data DQ in synchronization with the data strobe signal DQS which is received through the data strobe receiving circuit 163. The data transfer circuit 169 may transfer the data of the memory 160 to the memory controller 110. The register circuit 171 may store the data received by the data receiving circuit 167 during a write DQ training operation. The register circuit 171 may transfer the stored data to the data transfer circuit 169 as a feedback data FB_DQ. The register circuit 171 may be implemented with a first-in first-out (FIFO) type register. The multiplexer 172 may receive the sampling result SAMPLE and the feedback data FB_DQ. The multiplexer 172 may transfer the sampling result SAMPLE to the data transfer circuit 169 during a write leveling operation. The multiplexer 172 may transfer the feedback data FB_DQ stored in the register circuit 171 to the data transfer circuit 169 during a write DQ training operation. A mode signal M inputted to the multiplexer 172 may be a signal for distinguishing a write leveling operation and a write DQ training operation from each other.

During a normal write operation, the data received through the data receiving circuit 167 may be stored in a cell array (not shown). During a normal read operation, the data stored in the cell array may be transferred to the memory controller 169 through the data transfer circuit 169.

FIGS. 2A, 2B, 2C, and 2D are timing diagrams illustrating a write leveling operation of a memory system in accordance with an embodiment of the present invention, for example, the memory system 100 of FIG. 1. The clock CLK and the data strobe signal DQS may be signals having the same frequency. However, during a write leveling operation, the data strobe signal DQS may have a half (½) frequency of the clock CLK.

Figure 2A:
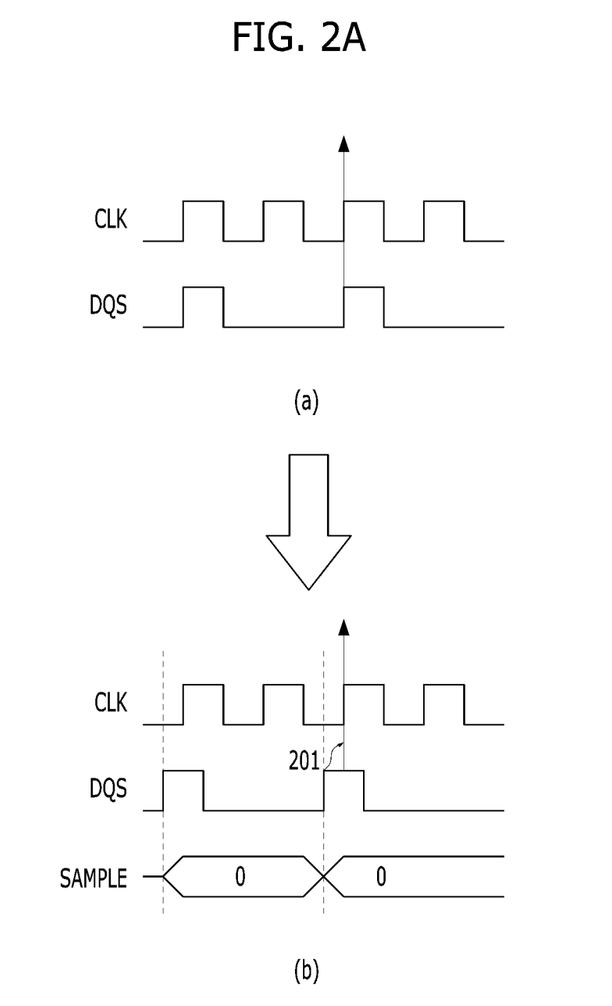
FIGS. 2A, 2B, 2C, and 2D are timing diagrams illustrating a write leveling operation of a memory system in accordance with an embodiment of the present invention.

In FIG. 2A, (a) shows a clock CLK and a data strobe signal DQS at a transfer end, that is, on the side of the memory controller 110. FIG. 2A(a) shows that a rising edge of the clock CLK and a rising edge of the data strobe signal DQS may be aligned at the transfer end.

In FIG. 2A, (b) shows a clock CLK and a data strobe signal DQS at a receiving end, that is, on the side of the memory 160. A path through which the clock CLK is transferred and a path through which the data strobe signal DQS is transferred are different in the memory system 100. Thus, even though the memory controller 110 transfers the clock CLK and the data strobe signal DQS by aligning a rising edge of the clock CLK to a rising edge of the data strobe signal DQS, the clock CLK and the data strobe signal DQS may be received misaligned in the memory 160. The clock sampling circuit 165 may sample the clock CLK at a rising edge of the data strobe signal DQS. For example, the sampling result SAMPLE may be generated to have a value of '0'. The first training control circuit 123 may receive the sampling result SAMPLE and increase the delay value of the data strobe signal delay circuit 115 based on the sampling result SAMPLE having a value of '0'. The first training control circuit 123 may continue to increase the delay value of the data strobe signal delay circuit 115 until the sampling result SAMPLE is changed to have a value of '1'. As a result, as shown in 201 of FIG. 2A, the delay value of the data strobe signal DQS may be adjusted such that a rising edge of the data strobe signal DQS and a rising edge of the clock CLK may be aligned on the side of the memory 110.

Figure 2B:
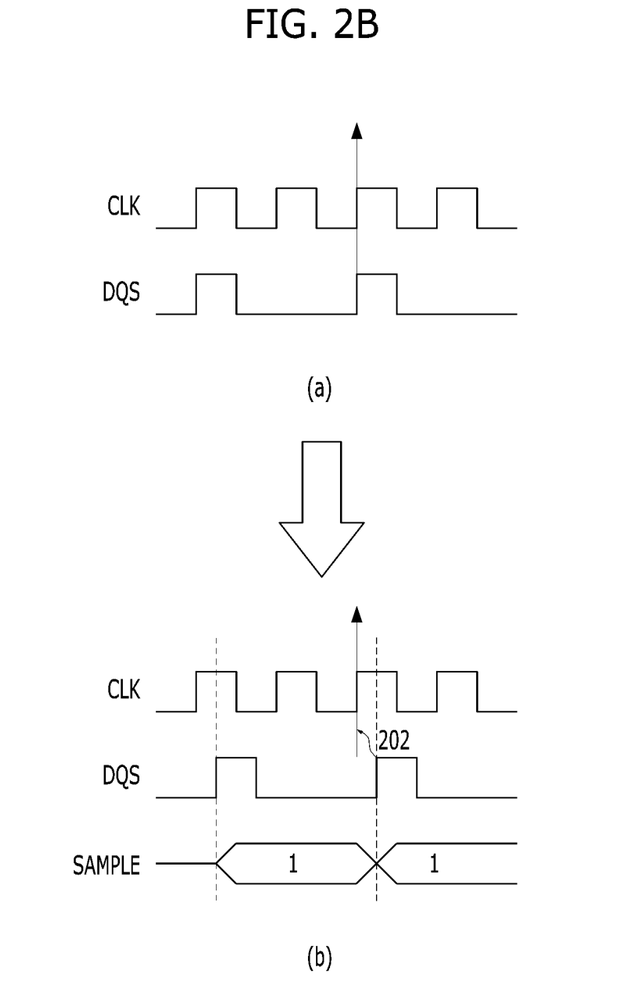

In FIG. 2B, (a) shows a clock CLK and a data strobe signal DQS at a transfer end, that is, on the side of the memory controller 110. FIG. 2B(a) shows that a rising edge of the clock CLK and a rising edge of the data strobe signal DQS may be aligned at the transfer end.

In FIG. 2B, (b) shows a clock CLK and a data strobe signal DQS at a receiving end, that is, on the side of the memory 160. The clock sampling circuit 165 may sample the clock CLK at a rising edge of the data strobe signal DQS. For example, the sampling result SAMPLE may be generated to have a value of '1'. The first training control circuit 123 may receive the sampling result SAMPLE and decrease the delay value of the data strobe signal delay circuit 115 based on the sampling result SAMPLE having a value of '1'. The first training control circuit 123 may continue to decrease the delay value of the data strobe signal delay circuit 115 until the sampling result SAMPLE is changed to have a value of '0'. As a result, as shown in 202 of FIG. 2B, the delay value of the data strobe signal DQS may be adjusted such that a rising edge of the data strobe signal DQS and a rising edge of the clock CLK may be aligned on the side of the memory 110.

Figure 2C:
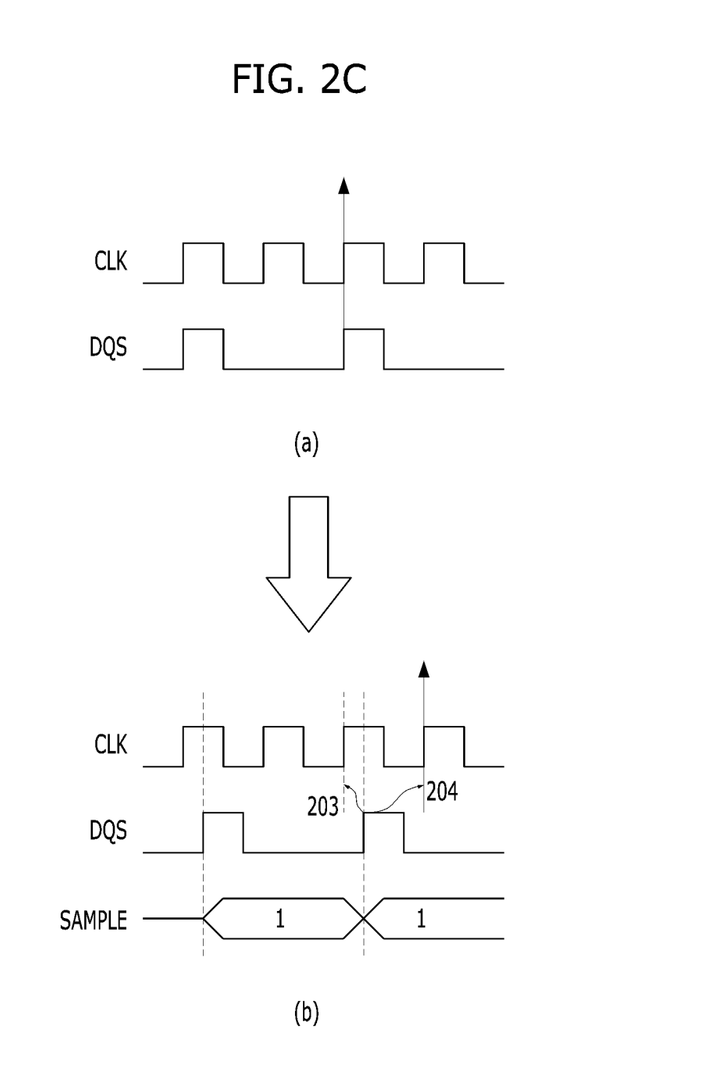

In FIG. 2C, (a) shows a clock CLK and a data strobe signal DQS at a transfer end, that is, on the side of the memory controller 110. FIG. 2C(a) shows that a rising edge of the clock CLK and a rising edge of the data strobe signal DQS may be aligned at the transfer end.

In FIG. 2C, (b) shows a clock CLK and a data strobe signal DQS at a receiving end, that is, on the side of the memory 160. The clock sampling circuit 165 may sample the clock CLK at a rising edge of the data strobe signal DQS. For example, (b) shows a case where the data strobe signal DQS goes ahead of the clock CLK compared with the case of (b) of FIG. 2A, but the sampling result SAMPLE may be generated to have a value of '1'. The first training control circuit 123 may receive the sampling result SAMPLE and decrease the delay value of the data strobe signal delay circuit 115 based on the sampling result SAMPLE having a value of '1'. The first training control circuit 123 may continue to decrease the delay value of the data strobe signal delay circuit 115 until the sampling result SAMPLE is changed to have a value of '0'. As a result, as shown in 203 of FIG. 2C, the delay value of the data strobe signal DQS may be adjusted. The delay value of the data strobe signal DQS is actually supposed to be adjusted as shown in 204, but an error that a rising edge of the data strobe signal DQS is aligned to a rising edge of the clock CLK which is one clock ahead may occur.

Figure 2D:
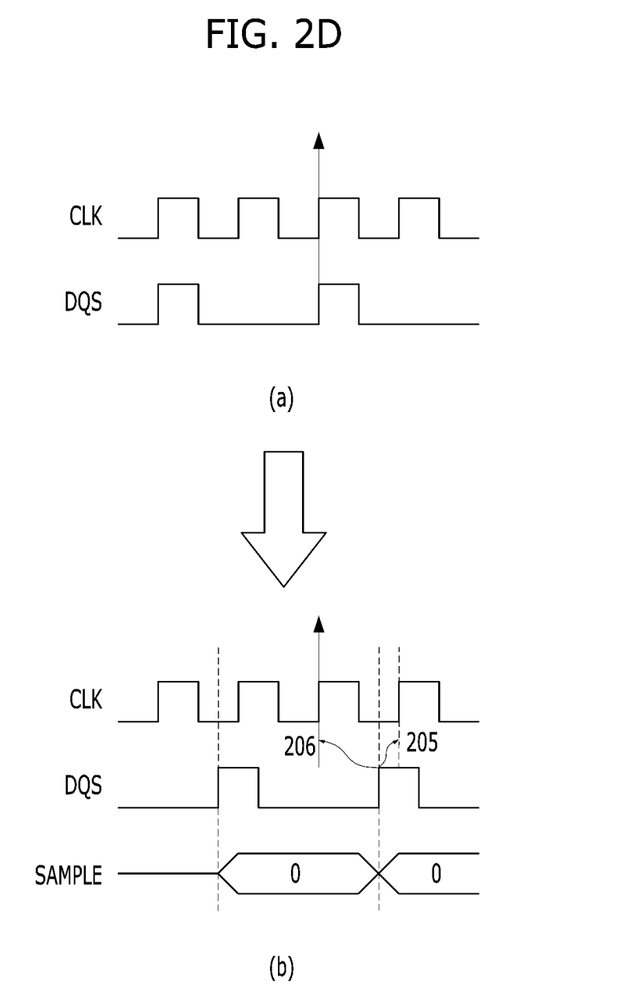

In FIG. 2D, (a) shows a clock CLK and a data strobe signal DQS at a transfer end, that is, on the side of the memory controller 110. FIG. 2D(a) shows that a rising edge of the clock CLK and a rising edge of the data strobe signal DQS may be aligned at the transfer end.

In FIG. 2D, (b) shows a clock CLK and a data strobe signal DQS at a receiving end, that is, on the side of the memory 160. The clock sampling circuit 165 may sample the clock CLK at a rising edge of the data strobe signal DQS. For example, (b) shows a case where the data strobe signal DQS goes behind the clock CLK compared with the case of (b) of FIG. 2B, but the sampling result SAMPLE may be generated to have a value of '0'. The first training control circuit 123 may receive the sampling result SAMPLE and increase the delay value of the data strobe signal delay circuit 115 based on the sampling result SAMPLE having a value of '0'. The first training control circuit 123 may continue to increase the delay value of the data strobe signal delay circuit 115 until the sampling result SAMPLE is changed to have a value of '1'. As a result, as shown in 205 of FIG. 2D, the delay value of the data strobe signal DQS may be adjusted. The delay value of the data strobe signal DQS is actually supposed to be adjusted as shown in 206, but an error that a rising edge of the data strobe signal DQS is aligned to a rising edge of the clock CLK which is one clock behind may occur.

The data strobe signal DQS and the clock CLK may be aligned by the write leveling operation of the memory system 100 as shown in (b) of FIG. 2A or (b) of FIG. 2B. However, when the data strobe signal DQS and the clock CLK are greatly distorted, the data strobe signal DQS and the clock CLK may be aligned with an error of one clock as shown in (b) of FIG. 2C and (b) of FIG. 2D.

Figure 3:
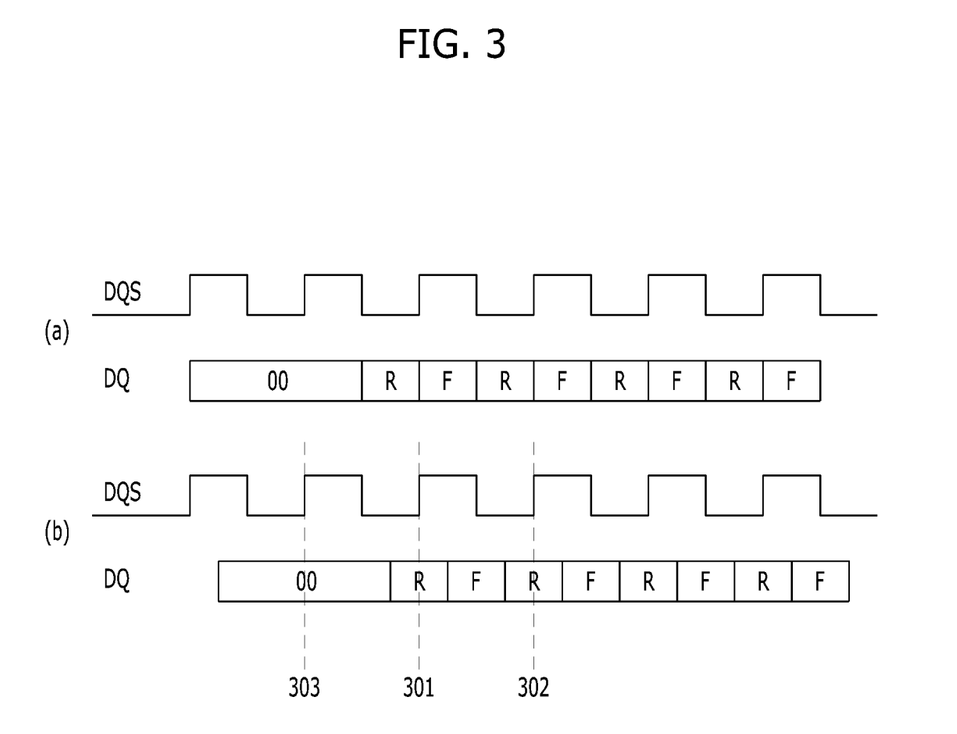
FIG. 3 illustrates a write DQ training operation of a memory system in accordance with an embodiment of the present invention.

FIG. 3 illustrates a write DQ training operation of a memory system in accordance with an embodiment of the present invention, for example, the memory system 100 of FIG. 1.

In FIG. 3, (a) shows data DQ and a data strobe signal DQS on the side of a receiving end before a write DQ training operation. In (a), '00' may denote a signal transferred as '0' before the data, and R may denote a rising data which should be aligned to a rising edge of the data strobe signal DQS, and F may denote a falling data that should be aligned to a falling edge of the data strobe signal DQS. FIG. 3(a) shows that a rising edge of the data strobe signal DQS is not aligned to the center of the rising data R and a falling edge of the data strobe signal DQS is not aligned to the center of the falling data F.

In FIG. 3, (b) shows data DQ and a data strobe signal DQS on the side of the receiving end after a write DQ training operation. FIG. 3(b) shows that a rising edge of the data strobe signal DQS is aligned with the center of the rising data R and a falling edge of the data strobe signal DQS is aligned to the center of the falling data F. During a write DQ training operation, the second training control circuit 125 may control the data delay circuit 121 to shift the data DQ to the left, and may transfer the shifted data DQ to the memory 160. Further, the second training control circuit 125 may perform an operation of receiving a feedback data FB_DQ from the memory 160 and detecting a left edge of the data strobe signal DQS. The second training control circuit 125 may control the data delay circuit 121 to shift the data DQ to the right, and may transfer the shifted data DQ to the memory 160. Further, the second training control circuit 125 may perform an operation of receiving the feedback data FB_DQ from the memory 160 and detecting a right edge of the data strobe signal DQS. The delay value of the data delay circuit 121 may be adjusted in such a manner that the data DQ is received between the detected left edge and the detected right edge.

A normal write leveling operation may have to be performed in order to perform a write DQ training operation normally. When a write leveling operation is correctly performed as shown in FIGS. 2A and 2B, the memory 160 may recognize that the data DQ is received from the moment '301' and receive eight data (which includes four rising data R and four falling data F) correctly. However, when the write leveling operation is erroneously performed as shown in FIG. 2C, the memory 160 may recognize that the data DQ is received not from the moment '301' but from the moment '302' and may not correctly receive the eight data. This is because the memory 160 determines the moment when the data DQ is inputted based on the clock CLK. When the write leveling operation is erroneously performed as shown in FIG. 2D, the memory 160 may recognize that the data DQ is received not from the moment '301' but from the moment '303' and may not correctly receive the eight data.

When the inputted eight data include data such as (1,1,1,1,0,0,0,0) and it is recognized that the data DQ is inputted from the moment '301', the memory 160 may receive the data DQ as (1,1,1,1,0,0,0,0). However, when it is recognized that the data DQ is inputted from the moment '302', the memory 160 may receive the data DQ as (1, 1, 0, 0, 0, 0, 0, 0). When it is recognized that the data DQ is inputted from the moment '303', the memory 160 may receive the data DQ as (0, 0, 1, 1, 1, 1, 0, 0).

In short, when the write leveling operation is not correctly performed, the memory 160 may erroneously recognize the moment when the data DQ is inputted. Thus, the write DQ training operation may not be correctly performed and the write DQ training operation may fail.

Figure 4:
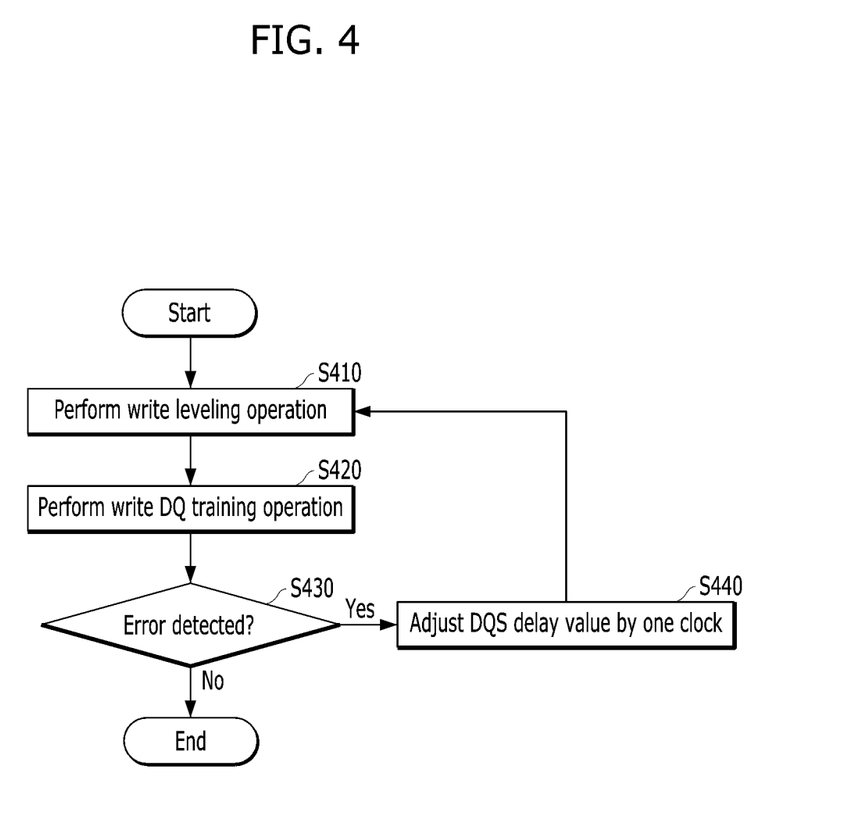
FIG. 4 is a flowchart illustrating a training operation of a memory system in accordance with an embodiment of the present invention.

FIG. 4 is a flowchart describing a training operation of a memory system in accordance with an embodiment of the present invention, for example, the memory system 100 of FIG. 1. The following training operation may be performed when the memory system 100 is initialized.

Referring to FIG. 4, a write leveling operation may be performed first at step S410. The write leveling operation may be performed by the memory controller 110 and the memory 160 in the same manner as described with reference to FIGS. 2A, 2B, 2C, and 2D. Through the write leveling operation, a rising edge of the clock CLK and a rising edge of the data strobe signal DQS may be aligned at the receiving end, that is, on the side of the memory 160.

A write DQ training operation may be performed at step S420 after performing the write leveling operation. The write DQ training operation may be performed by the memory controller 110 and the memory 160 in the same manner as shown in FIG. 3. Through the write DQ training operation, a rising edge and a falling edge of the data strobe signal DQS may be aligned to the center of the data DQ at the receiving end.

Whether or not an error has occurred may be detected in the write DQ training operation at step S430. When the write leveling operation is performed as shown in FIGS. 2A and 2B, an error may not occur in the write DQ training operation. However, when the write leveling operation is performed as shown in FIGS. 2C and 2D, there may be an error in the write DQ training operation. When there is no error in the write DQ training operation (N at the step S430), the training operation may end.

When an error occurs in the write DQ training operation (Y at the step S430), the delay value of the data strobe signal DQS may be adjusted by one clock at step S440. The delay value of the data strobe signal DQS may be adjusted as the second training control circuit 125 activates the error signal ERR and the first training control circuit 123 increases or decreases the delay value of the data strobe signal delay circuit 115 by one clock in response to an error signal. For example, the delay value of the data strobe signal delay circuit 115 may be increased or decreased by one clock. When an error occurs again after the delay value of the data strobe signal delay circuit 115 is increased by one clock, the delay value of the data strobe signal delay circuit 115 may be decreased by one clock. After the delay value of the data strobe signal DQS is adjusted, the processes of the steps S410 to S430 may be performed again.

Although not illustrated in FIG. 4, training operations related to operations other than a write operation, for example, a read training operation, may be performed between the write leveling operation and the write DQ training operation.

According to the training operation of FIG. 4, since the write leveling operation and the write DQ training operation are performed again after the delay value of the data strobe signal DQS is adjusted by one clock when an error occurs during the write DQ training operation, it is possible to prevent an error from occurring in the write DQ training operation due to an erroneous write leveling operation.

According to the embodiments of the present invention, errors of the training operations related to a write operation in the memory system may be reduced.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
a memory controller; and
a memory,
wherein the memory controller comprises:
a clock transfer circuit suitable for transferring a clock;
a data strobe signal transfer circuit suitable for transferring a data strobe signal;
a data strobe signal delay circuit suitable for delaying a preliminary data strobe signal by a first delay value to generate the data strobe signal;
a first data receiving circuit;
a first data transfer circuit suitable for transferring data;
a data delay circuit suitable for delaying a preliminary data by a second delay value to generate the data;
a first training control circuit suitable for adjusting the first delay value in response to a signal received by the first data receiving circuit during a first training operation for alignment between the clock and the data strobe signal; and
a second training control circuit for adjusting the second delay value in response to a signal received by the first data receiving circuit during a second training operation for alignment between the data strobe signal and the data, and the memory comprises:
a clock receiving circuit suitable for receiving the clock;
a data strobe signal receiving circuit suitable for receiving the data strobe signal;
a clock sampling circuit suitable for sampling the clock in synchronization with the data strobe signal during the first training operation to produce a sampling result;
a second data receiving circuit suitable for receiving the data based on the data strobe signal that is received by the data strobe signal receiving circuit;
a second data transfer circuit suitable for transferring the sampling result during the first training operation, and feeding back the data received by the second data receiving circuit during the second training operation,
wherein, when the second training control circuit detects an error of the second training operation, the second training control circuit adjusts the first delay value.

2. The memory system of claim 1, wherein the second training operation is performed after the first training operation is completed, and
wherein the first training operation and the second training operation are performed again after the delay value of the data strobe signal delay circuit is adjusted in response to detecting an error of the second training operation.

3. The memory system of claim 2, wherein the first delay value is increased by one clock, when an error of the second training operation is detected.

4. The memory system of claim 2, wherein the first delay value is decreased by one clock, when an error of the second training operation is detected.

5. The memory system of claim 1, wherein the memory further comprises:
a register circuit suitable for temporarily storing the data received by the second data receiving circuit during the second training operation and providing the second data transfer circuit with the data.

\* \* \* \* \*